(12) United States Patent
Zhang (10) Patent No.: US 12,279,398 B2
(45) Date of Patent: Apr. 15, 2025

(54) WATER-COOLED RADIATOR WITH BUILT-IN PUMP SPRAYING WATERWAY STRUCTURE

(71) Applicant: DONGGUAN BINGDIAN INTELLIGENT SCIENCE & TECHNOLOGY CO., LTD., Dongguan (CN)

(72) Inventor: Fengqi Zhang, Tongliao (CN)

(73) Assignee: DONGGUAN BINGDIAN INTELLIGENT SCIENCE & TECHNOLOGY CO., LTD., Dongguan (CN)

( * ) Notice: Subject to any disclaimer, the term of this patent is extended or adjusted under 35 U.S.C. 154(b) by 273 days.

(21) Appl. No.: 18/190,363

(22) Filed: Mar. 27, 2023

(65) Prior Publication Data

US 2023/0240043 A1    Jul. 27, 2023

(51) Int. Cl.
*H05K 7/20*    (2006.01)

(52) U.S. Cl.
CPC .................. *H05K 7/20272* (2013.01)

(58) Field of Classification Search
CPC ........... H05K 7/20272; H05K 7/20263; H05K 7/20254
USPC ................. 165/80.4, 104.19, 104.22, 104.33
See application file for complete search history.

(56) References Cited

U.S. PATENT DOCUMENTS

| | | | |
|---|---|---|---|
| 6,343,478 B1* | 2/2002 | Chang | H01L 23/473 257/E23.098 |
| 8,245,764 B2* | 8/2012 | Eriksen | H01L 23/473 165/80.4 |
| 9,927,181 B2* | 3/2018 | Mounioloux | G06F 1/20 |
| 10,739,084 B2* | 8/2020 | Tsai | H05K 7/20254 |
| 10,962,297 B2* | 3/2021 | Agonafer | H01L 23/427 |
| 11,347,284 B2* | 5/2022 | Zhang | H05K 7/20136 |
| 11,460,035 B2* | 10/2022 | Tsung-Wei | F04D 29/522 |
| 11,460,036 B2* | 10/2022 | Tsung-Wei | F04D 25/062 |
| 11,638,366 B2* | 4/2023 | Zhang | H05K 7/20272 62/3.2 |
| 12,099,385 B2* | 9/2024 | Tsai | G06F 1/20 |
| 12,158,786 B2* | 12/2024 | Tsai | F04D 29/586 |
| 12,200,903 B2* | 1/2025 | Chiang | H05K 7/20272 |

(Continued)

FOREIGN PATENT DOCUMENTS

| | | |
|---|---|---|
| CN | 103630415 A | 3/2014 |
| CN | 209525631 U | 10/2019 |
| CN | 210247388 U | 4/2020 |

*Primary Examiner* — Claire E Rojohn, III (57) ABSTRACT

The present invention discloses a water-cooled radiator with built-in pump spraying waterway structure. A slot formed in the body bottom shell is separated into a water storage tank and a heat sink; a water inlet is formed in the heat sink, a water outlet is formed in the water storage tank, a through hole is formed in the water-stop plate, the radiating fin fixedly covers an opening of the heat sink; one end of the water inlet pipe is communicated with a water outlet end of the water-cooled box while the other end thereof is communicated with the water inlet, one end of the water outlet pipe is communicated with the water outlet while the other end thereof is communicated with a water inlet end of the water-cooled box, and the water pumping mechanism is arranged in the water storage tank. The present invention improves the water cooling efficiency.

8 Claims, 8 Drawing Sheets

(56) References Cited

U.S. PATENT DOCUMENTS

| | | | | |
|---|---|---|---|---|
| 2005/0230086 | A1* | 10/2005 | Wang | H01L 23/473 |
| | | | | 257/E23.098 |
| 2007/0163750 | A1* | 7/2007 | Bhatti | H01L 23/473 |
| | | | | 257/E23.098 |
| 2017/0045306 | A1* | 2/2017 | Tsai | H05K 7/20254 |
| 2017/0192471 | A1* | 7/2017 | Tsai | H01L 23/473 |
| 2017/0235350 | A1* | 8/2017 | Tsai | G06F 1/20 |
| | | | | 165/80.4 |
| 2018/0139865 | A1* | 5/2018 | Draht | H01L 23/473 |
| 2018/0213677 | A1* | 7/2018 | Wu | H01L 23/473 |
| 2018/0259267 | A1* | 9/2018 | Tsai | H05K 7/20263 |
| 2018/0332734 | A1* | 11/2018 | Bandorawalla | H01L 21/4882 |
| 2018/0340744 | A1* | 11/2018 | Tsai | F28D 15/00 |
| 2022/0015263 | A1* | 1/2022 | Zhang | H05K 7/20263 |
| 2023/0240043 | A1* | 7/2023 | Zhang | H01L 23/473 |
| | | | | 165/80.4 |
| 2025/0056762 | A1* | 2/2025 | Zhang | H05K 7/20272 |

* cited by examiner

WATER-COOLED RADIATOR WITH BUILT-IN PUMP SPRAYING WATERWAY STRUCTURE

TECHNICAL FIELD

The present relates to the technical field of radiators, and particularly relates to a water-cooled radiator with built-in pump spraying waterway structure.

BACKGROUND

CPU and other electronic components will generate a large number of heat during work. In the prior art, the electronic components are radiated by adopting a water-cooled radiator, so that the service lives of the electronic components are prevented from being shortened or the electronic components are prevented from being damaged due to overheat. However, the existing water-cooled radiator generally conducts the heat, generated by the electronic components, through a radiating fin, and then the heat is conducted to a microchannel. A circulating coolant flows to the other end from this end of the microchannel, so as to take away the heat; although this structure implements water-cooled radiation, during a process that the coolant flows to the other end from one end of the microchannel, the temperature of the coolant rises gradually, and when the coolant flows through a second half section of the microchannel, the heat absorption capacity will be reduced gradually compared with that of a first half section of the microchannel, and therefore, the water cooling efficiency of the traditional water-cooled radiator still has room for improvement. In this case, the applicant is dedicated to researching a water-cooled radiator with a built-in pump spraying waterway structure, to implement further improvement of the water tooling efficiency.

SUMMARY

The present invention aims at implementing further improvement of the water cooling efficiency.

In order to implement the above-mentioned objective, the present invention adopts the following technical solution:
a water-cooled radiator with a built-in pump spraying waterway structure, including a water-cooled box, a water inlet pipe, a water outlet pipe, a water pumping mechanism, a body bottom shell, a water-stop plate, a waterway cover plate and a radiating fin; a slot is formed in the body bottom shell, the water-stop plate is fixedly spaced in the middle of the slot and separates the slot into a water storage tank and a heat sink; and a water inlet is formed in an inner wall of the heat sink, a water outlet is formed in an inner wall of the water storage tank, a through hole is formed in the middle of the water-stop plate, and the radiating fin fixedly covers an opening of the heat sink.

One end of the water inlet pipe is communicated with a water outlet end of the water-cooled box while the other end thereof is communicated with the water inlet, one end of the water outlet pipe is communicated with the water outlet while the other end thereof is communicated with a water inlet end of the water-cooled box, and the water pumping mechanism is arranged in the water storage tank.

A microchannel is fixedly arranged on the side of the radiating fin close to the body bottom shell, a drainage channel and a transverse groove are formed in the waterway cover plate, one end of the drainage channel is communicated with the middle of the transverse groove while the other end thereof is communicated with the water inlet, and the transverse groove is vertically formed in the middle of the microchannel.

Further, the water-cooled radiator further includes waterway rubber, which is fixedly arranged between the waterway cover plate and the microchannel, a water outlet groove and a buffer wall are formed in the waterway rubber, the water outlet groove fits with the transverse groove mutually, a buffer groove is formed in the microchannel, and the buffer wall is buckled into the buffer groove.

Further, the water-cooled radiator further includes a waterway sealing ring, which is fixedly arranged between the radiating fin and the body bottom shell.

Further, the water pumping mechanism includes a drive mechanism and an impeller, the impeller is hinged in the water storage tank, and the drive mechanism drives the impeller to rotate.

Further, the water-cooled radiator further includes a circuit control board, and the water pumping mechanism is electrically connected to the circuit control board.

Further, an LED light is fixedly arranged on the circuit control board, and the LED light is electrically connected to the circuit control board.

Further, the water-cooled radiator further includes a lampshade, which is fixedly arranged on the body bottom shell, and the lampshade covers the LED light.

Further, the drive mechanism is a nine-stage and three-phase motor.

The present invention has the following beneficial effects: when the present invention works, the coolant pumped by the water pumping mechanism in the water-cooled box realizes circular flowing, the coolant enters the heat sink from the water-cooled box through the water inlet pipe; when flowing through the microchannel, the coolant takes away the heat conducted from the radiating fin, then the coolant flows into the water storage tank through the through hole in the water-stop plate, and finally the coolant flows into the water-cooled box again through the water outlet pipe for radiating, thereby implementing the circular flowing. After the coolant enters the water inlet from the water inlet pipe, the coolant flows to the middle of the transverse groove along the drainage channel, and then the coolant flows into the microchannel from the transverse groove. Since the transverse groove is vertically arranged in the middle of the microchannel, the coolant, flowing out of the transverse groove, flows from the middle of the microchannel, and flows out of the two side ends of the microchannel, and this design is conductive to contacting the coolant with the microchannel at a lower temperature, so as to take away more heat. Compared with a traditional structure, the present invention further improves the water cooling efficiency.

NUMERALS IN THE DRAWINGS

Water-cooled box 11, water inlet pipe 12, water outlet pipe 13, water pumping mechanism 14, lampshade 15, circuit control board 21, body bottom shell 22, water-stop plate 23, through hole 231, waterway cover plate 24, drainage channel 241, transverse groove 242, waterway rubber 25, water outlet groove 251, buffer wall 252, radiating fin 26, microchannel 261, buffer groove 262, waterway sealing ring 27, water inlet 31, water outlet 32.

Slot 22a, water storage tank 22b, heat sink 22c, water outlet end 11a, water inlet end 11b, drive mechanism 14a, impeller 14b, LED light 21a.

DETAILED DESCRIPTION

The present invention is further described below in combination with drawings.

As shown in FIG. 1 to FIG. 8, a water-cooled radiator with a built-in pump spraying waterway structure includes a circuit control board 21, a water-cooled box 11, a water inlet pipe 12, a water outlet pipe 13, a water pumping mechanism 14, a body bottom shell 22, a water-stop plate 23, a waterway cover plate 24, waterway rubber 25, a radiating fin 25, a waterway sealing ring 27 and a lampshade 15.

Figure 5:
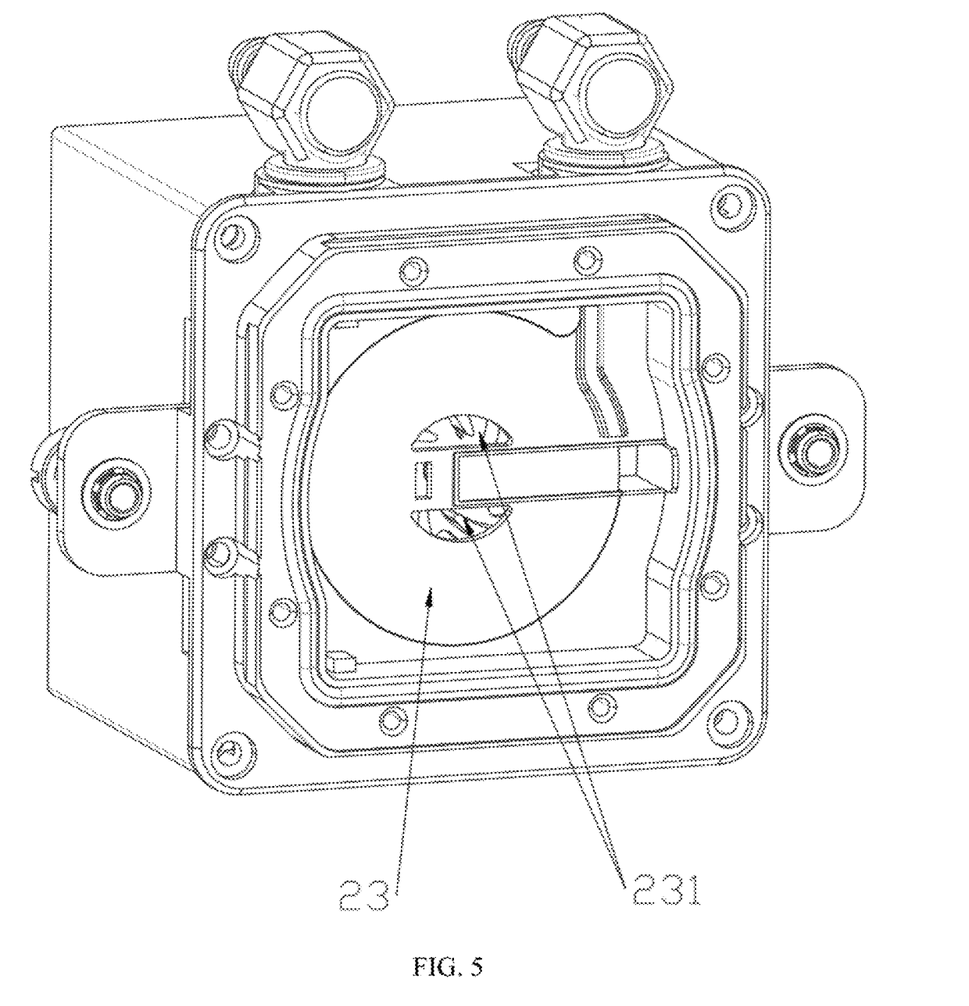
FIG. 5 is a structural schematic diagram of installing a water-stop plate in a slot in the present invention.

A slot 22a is tanned in the body bottom shell 22, the water-stop plate 23 is fixedly spaced in the middle of the slot 22a and separates the slot 22a into a water storage tank 22b and a heat sink 22e. A water inlet 31 is feinted in an inner wall of the heat sink 22c, a water outlet 32 is formed in an inner wall of the water storage tank 22b, a through hole 231 is formed in a middle of the water-stop plate 23, the radiating fin 26 fixedly covers an opening of the heat sink 22c, and the waterway sealing ring 27 is fixedly arranged between the radiating fin 26 and the body bottom shell 22.

One end of the water inlet pipe 12 is communicated with a water outlet end 11a of the water-cooled box 11 while the other end thereof is communicated with the water inlet 31, one end of the water outlet pipe 13 is communicated with the water outlet 32 while the other end thereof is communicated with a water inlet end 11b of the water-cooled box 11, so circular flowing is formed among the water-cooled box 11, the water inlet pipe 12, the heat sink 22c, the water storage tank 22b, the water outlet pipe 13 and the water-cooled box 11; the water pumping mechanism 14 is electrically connected to the circuit control board 21, and is arranged in the water storage tank 22b for pumping the coolant to flow.

Figure 6:
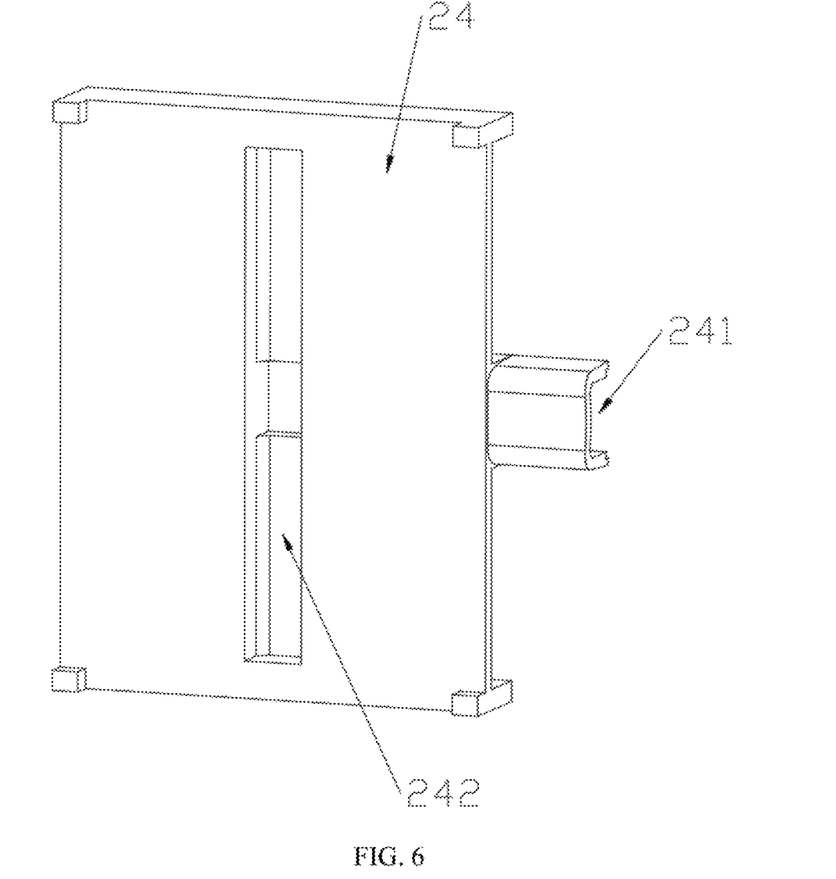
FIG. 6 is a structural schematic diagram of a waterway cover plate in the present invention.
Figure 7:
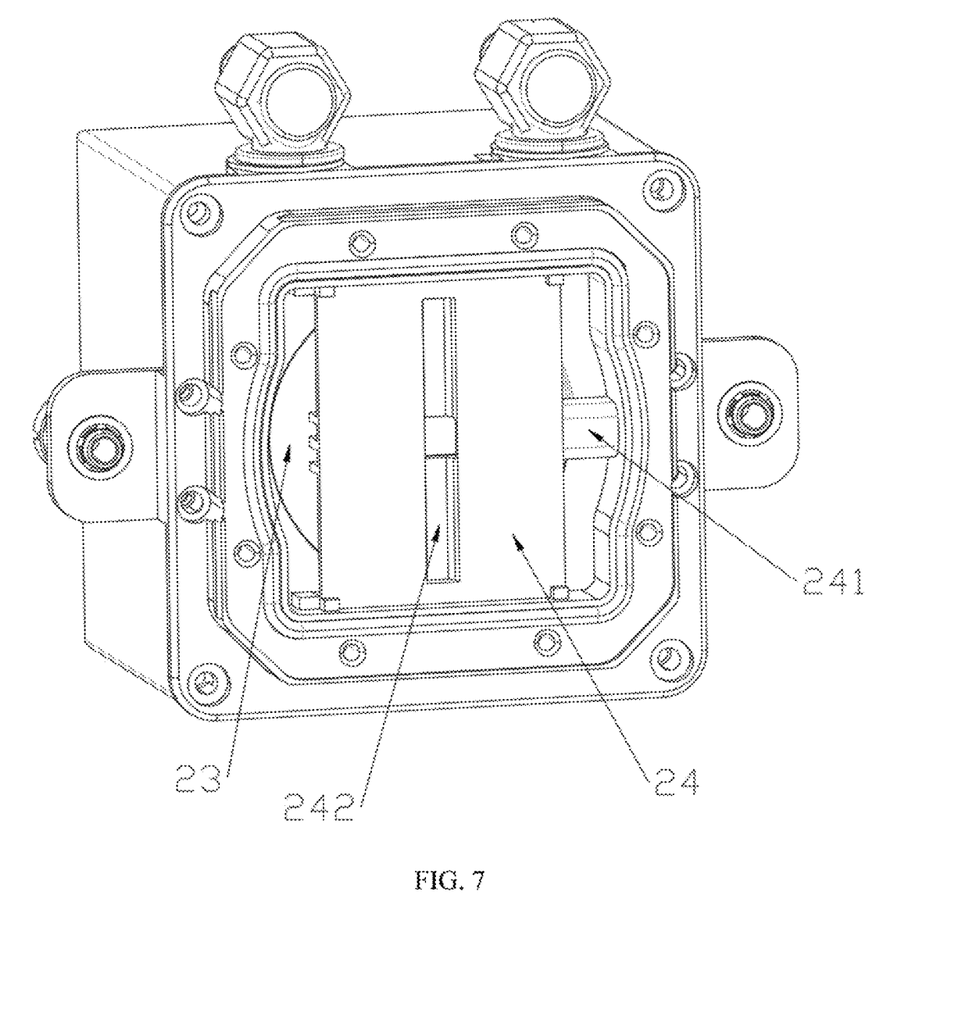
FIG. 7 is a structural schematic diagram of mounting a waterway cover plate in the slot in the present invention.

A microchannel 261 is fixedly arranged on the side of the radiating fin 26 close to the body bottom shell 22, a drainage channel 241 and a transverse groove 242 are formed in the waterway cover plate 24, one end of the drainage channel 241 is communicated with the middle of the transverse groove 242 while the other end thereof is communicated with the water inlet 31, and the transverse groove 242 is vertically arranged in the middle of the microchannel 261. The coolant in the water inlet pipe 12 enters the drainage channel 241 from the water inlet 31 and finally enters the transverse groove 242. Since the transverse groove 242 is vertically arranged in the middle of the microchannel 261, the coolant in the transverse groove 242 enters the microchannel 261 from the middle of the microchannel 261, and flows out of both ends of the microchannel 261.

When the present invention works, the coolant pumped by the water pumping mechanism 14 in the water-cooled box 11 realizes circular flowing, the coolant flows into the heat sink 22c from the water-cooled box 11 through the water inlet pipe 12; when flowing through the microchannel 261, the coolant takes away the heat conducted from the radiating fin 26, then the coolant flows into the water storage tank 22b through the through hole 231 in the water-stop plate 23, and finally the coolant flows into the water-cooled box 11 again through the water outlet pipe 13 for radiating, thereby implementing the circular flowing.

Figure 8:
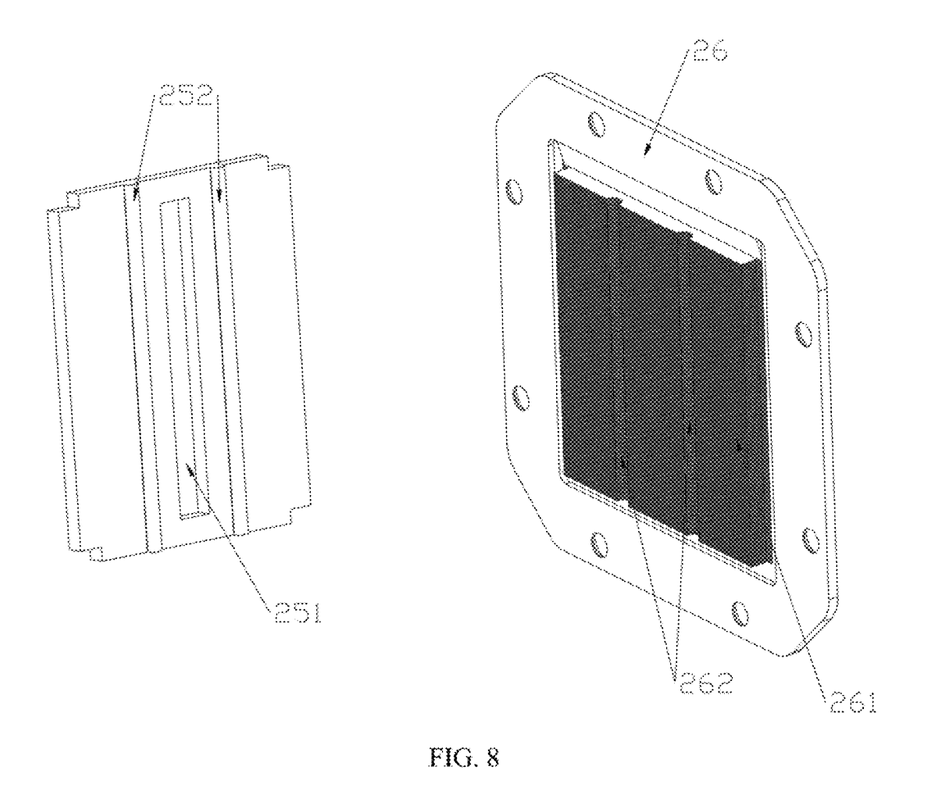
FIG. 8 is a structural schematic diagram of waterway rubber and a radiating fin in the present invention.

The waterway rubber 25 is fixedly arranged between the waterway cover plate 24 and the microchannel 261, a water outlet groove 251 and a buffer wall 252 are formed in the waterway rubber 25, the water outlet groove 251 fits with the transverse groove 242 mutually, namely, the water outlet groove 251 is overlapped with the transverse groove 242; a buffer groove 262 is formed in the microchannel 261, and the buffer wall 252 is buckled into the buffer groove 262. The buffer wall 252 plays a role of buffering the coolant flowing through the microchannel 261, so as to decrease the flowing speed of the coolant, prolong the contact time with the microchannel 261, and help absorb more heat.

Figure 4:
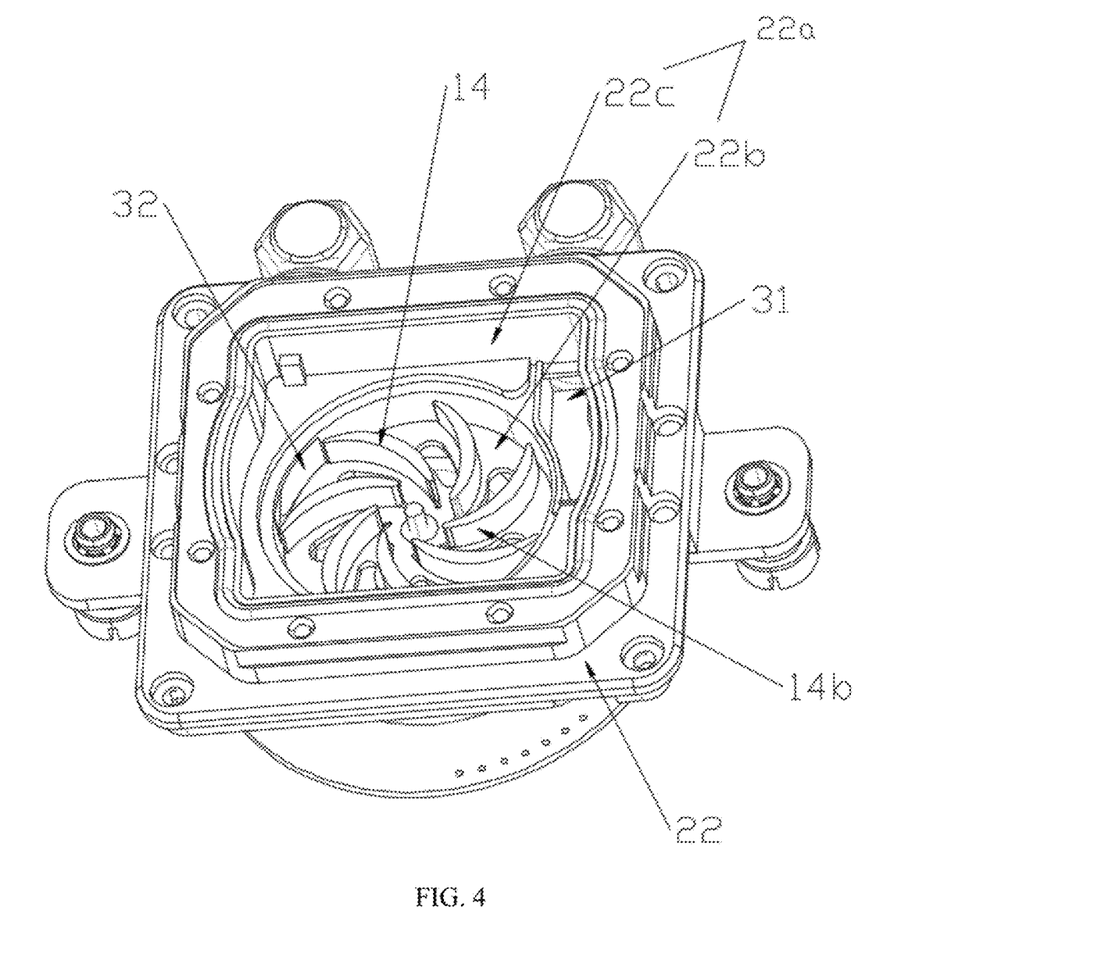
FIG. 4 is a schematic diagram of an internal structure of a water storage tank in the present invention.

The water pumping mechanism 14 includes a drive mechanism 14a and an impeller 14b, the drive mechanism 14a is a nine-stage and three-phase motor, the impeller 14b is hinged in the water storage tank 22b, the drive mechanism 14a drives the impeller 14b to rotate, and when the impeller 14b rotates, the coolant in the water storage tank 22b is thrown into the water outlet pipe 13 from the water outlet 32, thereby implementing the circular flowing of the coolant.

Figure 1:
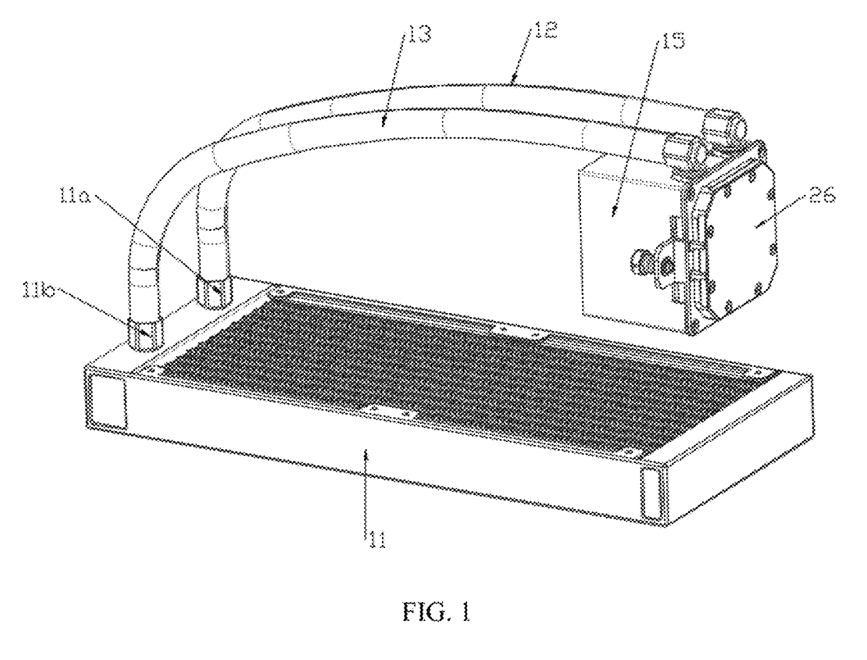
FIG. 1 is a schematic diagram, of an overall structure of the present invention.
Figure 2:
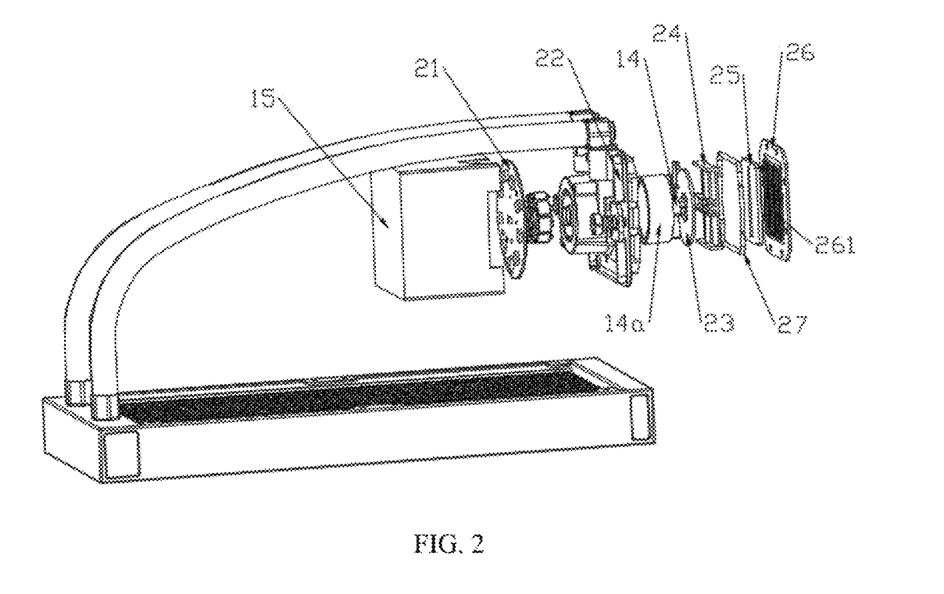
FIG. 2 is an exploded diagram of a partial structure of the present invention.
Figure 3:
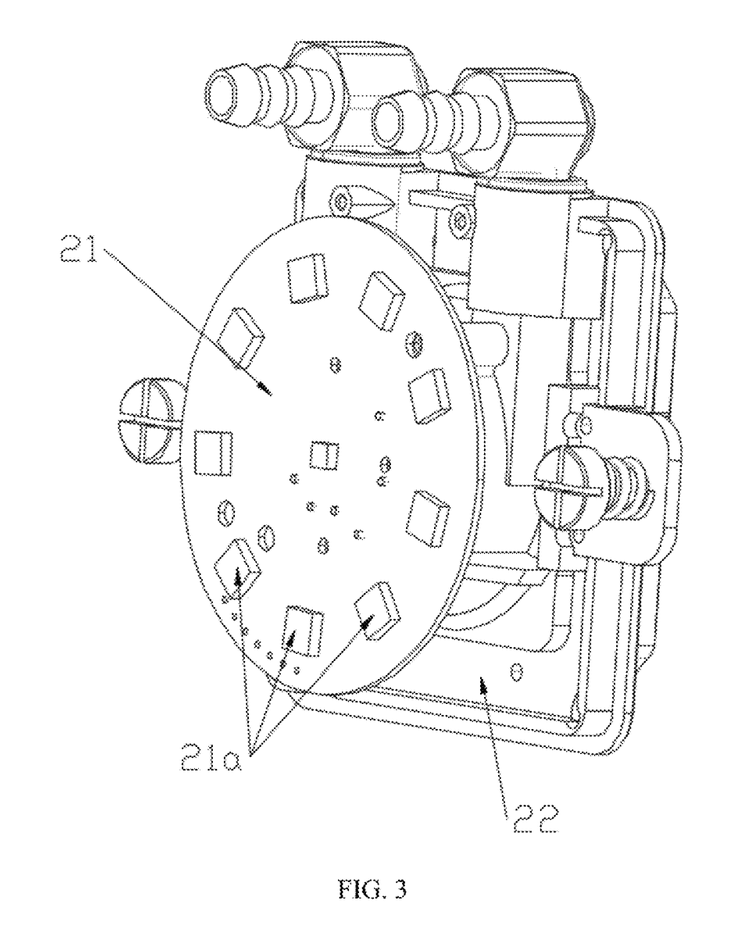
FIG. 3 is a schematic diagram of an internal structure of a lampshade in the present invention.

An LED light 21a is fixedly arranged on the circuit control board 21, and the LED light 21a is electrically connected to the circuit control board 21. The lampshade 15 is fixedly arranged on the body bottom shell 22, and the lampshade 15 covers the LED light 21a, the circuit control board 21 controls the LED light 21a to emit light, and the emitted light is emitted through the lampshade 15, so that the present invention has a cooler appearance.

The present invention has the following working principles: when the present invention works, the coolant pumped by the water pumping mechanism 14 in the water-cooled box 11 realizes circular flowing, the coolant enters the heat sink 22c from the water-cooled box 11 through the water inlet pipe 12; when flowing through the water inlet 31, the coolant in the water inlet pipe 12 enters the drainage channel 241 and finally enters the transverse groove 242. Since the transverse groove 242 is vertically formed in the middle of the microchannel 261, the coolant in the transverse groove 242 enters the microchannel 261 from the middle of the microchannel 261 and flows out of both ends of the microchannel 261; when flowing through the microchannel 261, the buffer wall 252 plays a role of buffering the coolant flowing through the microchannel 261, so as to decrease the flowing speed of the coolant, prolong the contact time with the microchannel 261 and take away more heat conducted from the radiating fin 26, the coolant flows into the water storage tank 22b through the through hole 231 in the water-stop plate 23, and finally flows to the water-cooled box 11 again through the water outlet pipe 13 for radiating, thereby implementing the circular flowing.

The above disclosed is only a preferred embodiment of the present invention, rather than limiting the claim protection scope of the present invention, therefore any equivalent variation made based on the scope of the patent applied in the present invention still belongs to the scope of the present invention, and the above is not intend to make any limitation to the technical scope of the present disclosure, and any amendment, equivalent variation and modification made to the above embodiments based on the technical essence of the present invention all fall into the scope of the technical solution of the present invention.

What is claimed is:

1. A water-cooled radiator with built-in pump spraying waterway structure, comprising a water-cooled box, a water inlet pipe, a water outlet pipe, a water pumping mechanism, a body bottom shell, a water-stop plate, a waterway cover plate and a radiating fin, wherein a slot is formed in the body bottom shell, the water-stop plate is fixedly spaced in the middle of the slot and separates the slot into a water storage tank and a heat sink, a water inlet is formed in an inner wall of the heat sink, a water outlet is formed in an inner wall of the water storage tank, a through hole is formed in the middle of the water-stop plate, and the radiating fin fixedly covers an opening of the heat sink;

one end of the water inlet pipe is communicated with a water outlet end of the water-cooled box while the other end thereof is communicated with the water inlet, one end of the water outlet pipe is communicated with the water outlet while the other end thereof is communicated with a water inlet end of the water-cooled box, and the water pumping mechanism is arranged in the water storage tank; and a microchannel is fixedly arranged on the side of the radiating fin close to the body bottom shell, a drainage channel and a transverse groove are formed in the waterway cover plate, one end of the drainage channel is communicated with a middle of the transverse groove while the other end thereof is communicated with the water inlet, and the transverse groove is vertically formed in the middle of the microchannel.

2. The water-cooled radiator with built-in pump spraying waterway structure according to claim 1, further comprising waterway rubber, fixedly arranged between the waterway cover plate and the microchannel, a water outlet groove and a buffer wall are arranged on the waterway rubber, the water outlet groove fits with the transverse groove mutually, a buffer groove is formed in the microchannel, and the buffer wall is buckled into the buffer groove.

3. The water-cooled radiator with built-in pump spraying waterway structure according to claim 1, further comprising a waterway sealing ring, fixedly arranged between the radiating fin and the body bottom shell.

4. The water-cooled radiator with built-in pump spraying waterway structure according to claim 1, wherein the water pumping mechanism comprises a drive mechanism and an impeller, the impeller is hinged in the water storage tank, and the drive mechanism drives the impeller to rotate.

5. The water-cooled radiator with built-in pump spraying waterway structure according to claim 1, further comprising a circuit control board, and the water pumping mechanism is electrically connected to the circuit control board.

6. The water-cooled radiator with built-in pump spraying waterway structure according to claim 5, wherein an LED light is fixedly arranged on the circuit control board, and the LED light is electrically connected to the circuit control board.

7. The water-cooled radiator with built-in pump spraying waterway structure according to claim 6, further comprising a lampshade, fixedly arranged on the body bottom shell, and the lampshade covers the LED light.

8. The water-cooled radiator with built-in pump spraying waterway structure according to claim 4, wherein the drive mechanism is a nine-stage and three-phase motor.

* * * * *